(12) United States Patent
Spann et al.

(10) Patent No.: US 10,833,480 B2
(45) Date of Patent: Nov. 10, 2020

(54) DIFFUSION BLOCKING LAYER FOR A COMPOUND SEMICONDUCTOR STRUCTURE

(71) Applicant: Skorpios Technologies, Inc., Albuquerque, NM (US)

(72) Inventors: John Y. Spann, Albuquerque, NM (US); John Zyskind, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 16/502,929

(22) Filed: Jul. 3, 2019

(65) Prior Publication Data

US 2020/0169063 A1    May 28, 2020

Related U.S. Application Data

(60) Provisional application No. 62/693,626, filed on Jul. 3, 2018.

(51) Int. Cl.
| | | |
|---|---|---|
| *H01S 5/00* | (2006.01) | |
| *H01S 5/30* | (2006.01) | |
| *H01S 5/343* | (2006.01) | |
| *H01S 5/323* | (2006.01) | |

(52) U.S. Cl.
CPC .......... *H01S 5/3072* (2013.01); *H01S 5/3054* (2013.01); *H01S 5/3063* (2013.01); *H01S 5/3013* (2013.01); *H01S 5/3018* (2013.01); *H01S 5/3059* (2013.01); *H01S 5/323* (2013.01); *H01S 5/343* (2013.01)

(58) Field of Classification Search
CPC .... H01S 5/3072; H01S 5/3054; H01S 5/3059; H01S 5/3063; H01S 5/3013; H01S 5/3018; H01S 5/323; H01S 5/343
See application file for complete search history.

(56) References Cited

U.S. PATENT DOCUMENTS

| | | | | |
|---|---|---|---|---|
| 6,351,479 | B1* | 2/2002 | Mori | H01L 33/305 372/45.01 |
| 6,437,372 | B1* | 8/2002 | Geva | B82Y 20/00 257/102 |
| 6,798,808 | B1* | 9/2004 | Konushi | H01S 5/32308 372/45.01 |
| 9,166,364 | B2 | 10/2015 | Feitisch et al. | |
| 2003/0042479 | A1* | 3/2003 | Tsuchiya | H01L 21/02546 257/14 |
| 2008/0014671 | A1* | 1/2008 | Yamamoto | H01S 5/34326 438/45 |
| 2008/0240191 | A1* | 10/2008 | Takada | H01S 5/227 372/44.01 |

(Continued)

*Primary Examiner* — Kinam Park
(74) *Attorney, Agent, or Firm* — Kilpatrick Townsend & Stockton LLP

(57) ABSTRACT

A method of fabricating a gain medium includes growing a p-type layer doped with zinc on a substrate, growing an undoped layer including one or both of InP or InGaAsP on the p-type layer, growing a region that includes multiple quantum wells (MQWs) on the undoped layer, and growing an n-type layer on the region. The undoped layer has a thickness that is sufficient to prevent Zn diffusion from the p-type layer into the region during subsequent growth or wafer fabrication steps.

20 Claims, 5 Drawing Sheets

(56) References Cited

U.S. PATENT DOCUMENTS

| | | | |
|---|---|---|---|
| 2008/0283819 A1* | 11/2008 | Konno | H01L 33/0093 257/13 |
| 2015/0098676 A1 | 4/2015 | Krasulick et al. | |
| 2017/0085056 A1 | 3/2017 | Spann | |
| 2017/0141196 A1 | 5/2017 | Schulze et al. | |

* cited by examiner

DIFFUSION BLOCKING LAYER FOR A COMPOUND SEMICONDUCTOR STRUCTURE

CROSS-REFERENCE TO RELATED APPLICATIONS

This application is a non-provisional application of, and claims the benefit of priority of, U.S. Provisional Patent Application Ser. No. 62/693,626, filed 3 Jul. 2018, which is incorporated by reference herewith in its entirety for all purposes.

BACKGROUND

Compound semiconductors that have direct bandgaps are important in electronics, because they can respond to electrical stimuli by emitting light, and/or respond to receiving light by emitting electrical signals. Well-known compound semiconductors include III-V system materials that use one or more group III materials such as Ga, In or Al, and one or more group V materials such as N, P As or Sb. II-VI materials are also possible, with one or more group II materials such as Zn, Cd or Hg, and one or more group VI materials such as S, Se or Te. In the III-V systems, Zn, Cd or Mg are sometimes used as p-type dopants while Si is sometimes used as an n-type dopant.

SUMMARY

Systems and methods herein recognize the advantages of providing compound semiconductors with an undoped layer between one or more p-type layers doped with zinc, and further layers grown atop the p-type layer(s), so that the undoped layer mitigates dopant diffusion into the further layers.

In one or more embodiments, a gain medium includes a p-type layer, an undoped layer, a region that includes multiple quantum wells (MQWs), and an n-type layer. The p-type layer defines a first surface and an opposing second surface, and is doped using zinc. The undoped layer material defines a first surface and an opposing second surface that are separated by a thickness of the undoped layer, the thickness being within a thickness range of 5 nm to 500 nm. The first surface of the undoped layer adjoins the second surface of the p-type layer. The region that includes the MQWs defines a first surface and an opposing second surface that are separated by a thickness of the region. A first surface of the region adjoins the second surface of the undoped layer. The n-type layer defines a first surface and a second surface that are separated by a thickness of the n-type layer, the first surface of the n-type layer adjoining the second surface of the region. The p-type layer, the undoped layer, the region and the n-type layer are formed of one or more compound semiconductor materials that are characterized by epitaxially compatible crystalline lattice structures. The p-type layer, the undoped layer, the region and the n-type layer form a single crystalline structure that extends continuously from the p-type layer through the n-type layer.

In one or more embodiments, a method of fabricating a gain medium includes growing a p-type layer doped with zinc on a substrate, growing an undoped layer comprising one or more of InP, InGaAsP, InGaAlAs, or InGaAlAsP on the p-type layer, growing a region that includes MQWs on the undoped layer, and growing an n-type layer on the region. Growing the undoped layer includes growing the undoped layer to a thickness that is sufficient to prevent Zn diffusion from the p-type layer into the region during subsequent growth and/or wafer fabrication steps.

In one or more embodiments, a compound semiconductor layer stack for fabrication of an electronic device includes one or more p-type layers, formed of crystalline, compound semiconductor material grown on a crystalline substrate. At least one of the one or more p-type layers includes Zn as a dopant. The compound semiconductor layer stack also includes an undoped layer, formed of crystalline, compound semiconductor material grown on the one or more p-type layers, and one or more n-type layers, formed of crystalline, compound semiconductor material grown on the undoped layer. The undoped layer includes InP, InGaAsP, InGaAlAs, or InGaAlAsP, and is of sufficient thickness to reduce zinc diffusion from the p-type layer toward the n-type layers during growth of the one or more n-type layers.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

Embodiments are described in detail below with reference to the following figures, in which like numerals within the drawings and mentioned herein represent substantially identical structural elements.

DETAILED DESCRIPTION

Figure 1:
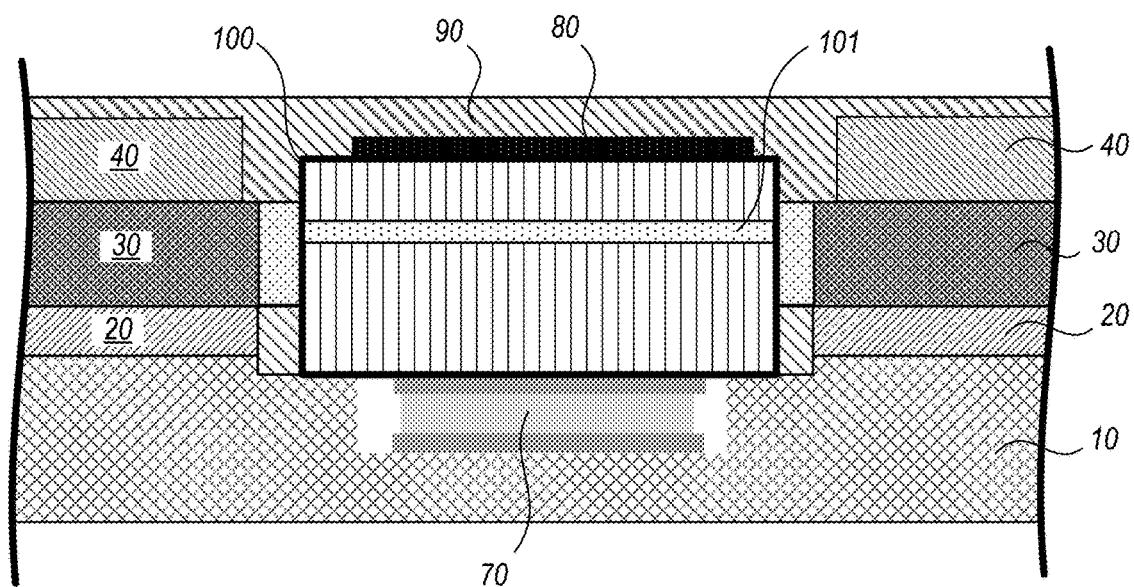
FIG. 1 illustrates a gain chip that is independently fabricated, then bonded into a substrate in an "n-up" configuration, and coupled with waveguides, e.g., as part of forming a solid state laser, according to one or more embodiments.

The subject matter of embodiments of the present invention is described here with specificity to meet statutory requirements, but this description is not intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described. Each example is provided by way of illustration and/or explanation, and not as a limitation. For instance, features illustrated or described as part of one embodiment may be used on another embodiment to yield a further embodiment. Upon reading and comprehending the present disclosure, one of ordinary skill in the art will readily conceive many equivalents, extensions, and alternatives to the specific, disclosed luminaire types, all of which are within the scope of embodiments herein.

In the following description, positional terms like "above," "below," "vertical," "horizontal" and the like are sometimes used to aid in understanding features shown in the drawings as presented, that is, in the orientation in which labels of the drawings read normally. These meanings are adhered to, notwithstanding that items described below (e.g., wafers, layer stacks, gain chips, photonic chips) could be inverted during fabrication and/or in subsequent uses.

In certain applications, such as photodiodes, or light-emitting devices of III-V materials that include multiple quantum well (MQW) regions, Zn or other p-type dopant contamination can impair performance and/or reliability. For example, in lasers, such dopants can act as non-radiative recombination centers in laser active regions. Over time, build-up can occur due to device bias, and can cause reliability problems. In photodiodes, photons generate electron-hole pairs in a depletion region, created by reverse biasing the semiconductor material, to provide electrical signals. Dopant migration into otherwise not intentionally doped areas can reduce the width of the depletion region under reverse bias, reducing responsivity to photons.

Certain embodiments herein are based on an appreciation that gain structures for solid state light emitter and/or laser applications may advantageously use Zn, Cd or Mg as p-type dopants in some layers, but may also employ strategies to limit migration of the dopant to other layers, for example MQWs of the gain structures, undoped regions of photodiodes and the like. For example, in some applications, a gain chip may be integrated with reflectors to form a solid state laser. It may be advantageous to modulate the gain chip at high speed to enable a correspondingly high bandwidth for communication applications. Such applications can benefit from electrical paths to the MQW regions being as limited as possible, because the currents required to increase and decrease light output from the MQW regions are at least somewhat proportional to the volume of the semiconductor material in the current path.

FIG. 1 illustrates a portion of a photonic chip, including a gain chip 100 that is independently fabricated, then coupled with a substrate 10, waveguides 30 and interconnect metal 80, e.g., as part of forming the photonic chip (e.g., a solid state laser). Gain chip 100 may be formed of a compound semiconductor material, and may include MQW region 101 and other structures, not shown in FIG. 1 due to the scale of the drawing, but described below. As known in the art, light can be generated within MQW region 101 and can transmit therefrom into waveguides 30. Gain chip 100 and the further structures shown in FIG. 1 are provided as just one illustration of use of a gain chip and do not limit the applicability of the concepts described further below. Upon reading and comprehending the present disclosure, one of ordinary skill in the art will readily conceive many equivalents, extensions, modifications, adaptations and alternatives to the specific structure shown in FIG. 1.

Gain chip 100 may be integrated with the surrounding structures and components as shown in FIG. 1 using techniques described in U.S. Pat. No. 9,316,785, and examples of solid state lasers and/or other systems thus formed may be found in U.S. Pat. No. 9,664,855. These patents are incorporated by reference in their entireties herein, for all purposes, and are further referred to as "the Incorporated Patents."

To generate the structure shown in FIG. 1, substrate 10 may be prepared by adding materials corresponding to a first cladding layer 20, waveguides 30, and a second cladding layer 40. Substrate 10, cladding layers 20 and 40, and waveguides 30 extend to regions beyond those shown in the photonic chip portion illustrated in FIG. 1. A recess may be etched into one or more of these materials, and optionally to some depth within substrate 10. A bonding material 70 may be formed within the recess, or may be formed atop gain chip 100 before it is flipped, aligned with the recess, and bonded using material 70. Spacers 50 may optionally be formed to about the height of cladding 20, and index matching elements 60 may optionally be formed between waveguides 30 and gain chip 100. Interconnect metal 80 may be formed atop gain chip 100, and may extend to other structures not shown in the photonic chip region depicted in FIG. 1. A passivation material 90 may be applied atop all structures of the photonic chip, and may be planarized (e.g., using chemical mechanical planarization) as shown in FIG. 1, or may be left in its as-deposited state without planarization. The processes discussed above and in the Incorporated Patents are generally derived from processes utilized in semiconductor fabrication, including photolithography, etching, depositions and the like. Upon reading and comprehending the present disclosure, one of ordinary skill in the art will readily conceive many equivalents, extensions, modifications, adaptations and alternatives.

Also, as is common in the art, key layers of gain chip 100 are first "grown" in wafer form using molecular beam epitaxy (MBE), metalorganic chemical vapor deposition (MOCVD) or the like. (The term "grown" is understood in the art to mean that successive layers of materials characterized by compatible crystalline lattice structures are formed on a substrate with a crystalline structure, and that the materials arrange themselves into position with respect to the crystalline structure to form layers that continue the original crystalline lattice.) Then, the wafer may be singulated into individual gain chips that are temporarily bonded to a transfer substrate, flipped, and individually transferred to the substrate shown in FIG. 1. Thus, either the wafer with the grown layers, or any of the individual chips formed therefrom, may be considered a gain medium.

In compound semiconductor gain chip 100, Si may be used as an n-type dopant for one set of layers (e.g., those layers shown above MQW region 101), while Zn, Cd or Mg may be used as p-type dopants for certain other layers. The assembled configuration is inverse to the sequence in which the layers are grown during MBE or MOCVD, because gain chip 100 is flipped as it transfers to the bonding site of a host substrate in which the photonic chip is integrated. Thus, layers of gain chip 100 to be used in a finished, "n-up" product configuration are actually grown starting with the n-layers at the "bottom" of the stack (e.g., nearest to the growth substrate), that is, in an as-grown, "p-up" configuration.

Figure 2:
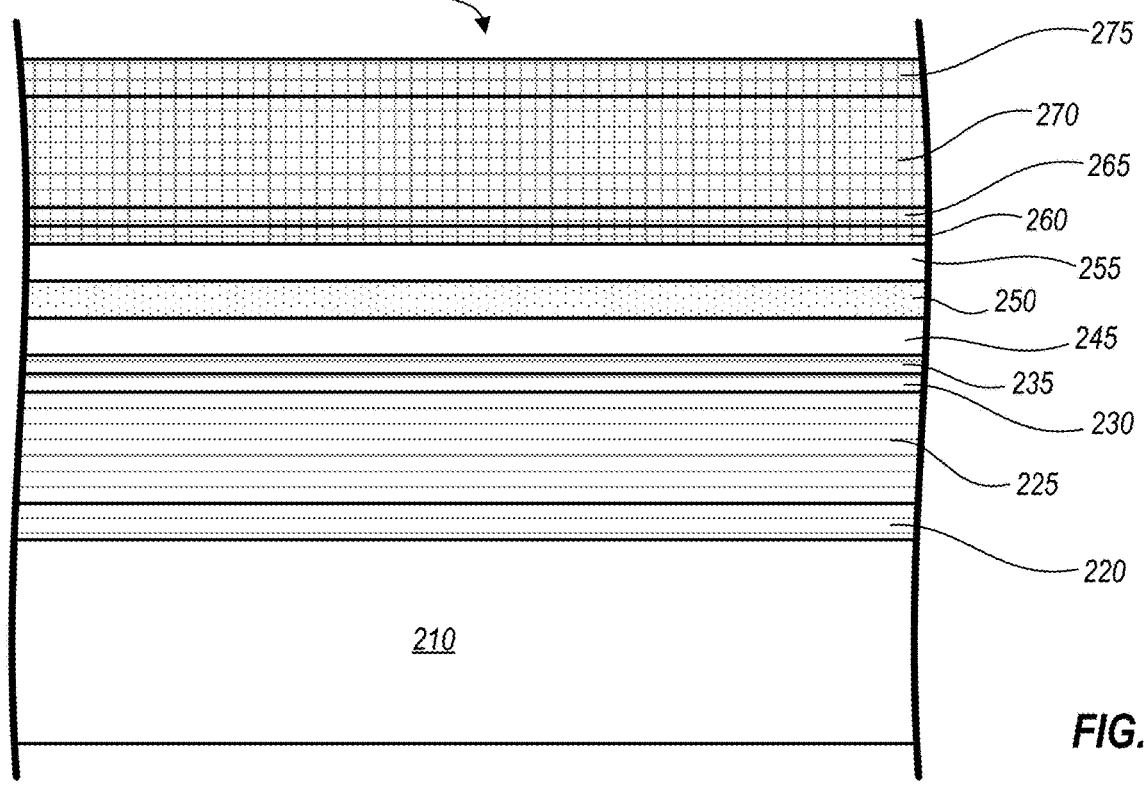
FIG. 2 shows a schematic cross-section of exemplary layers in a "p-up" as-grown configuration, as later used for the gain chip in FIG. 1, according to one or more embodiments.

A schematic cross-section of exemplary layers in an as-grown, "p-up" configuration 200 is shown in FIG. 2. Certain ones of the layers shown in as-grown, "p-up" configuration 200 are present to facilitate electrical contact, optical confinement and/or fabrication needs. Thus, many of these layers could be modified or omitted, and/or further layers could be added, depending at least on the desired final product, and the wafer fabrication tools available. Intentionally n- and p-type doped regions are indicated with different fill patterns; the MQW regions and immediately surrounding layers are not intentionally doped. Configuration 200 could be grown in wafer form and then singulated to form gain chip 100, FIG. 1. Configuration 200 begins with a compound semiconductor substrate 210 upon which n-type layers, a MQW region, and p-type layers are grown. In order, the exemplary layers of as-grown, "p-up" configuration 200 include an n contact layer 220, an n buffer layer 225, an n etch stop layer 230, an n spacer layer 235, an undoped confinement layer 245, MQWs 250, another undoped confinement layer 255, a p spacer layer 260, a p etch stop layer 265, a p buffer layer 270 and a p contact layer 275.

Recent study has shown that a finished, "p-up" product configuration can be preferable for high speed operation of a finished laser or other device. In the case of lasers, this is because the typically lower mobility of holes in the p-type contact, buffer and other layers, tends to confine current introduced through contacts at the top of the gain chip enroute to the MQWs, reducing the volume of semiconductor material to be modulated. This increases the maximum bandwidth of a laser or other device formed using gain chip 100. The "p-up" product configuration requires that the gain chip be grown in an as-grown, "n-up" configuration, because of the flipping required to integrate the gain chip with the other solid-state laser components.

Figure 3:
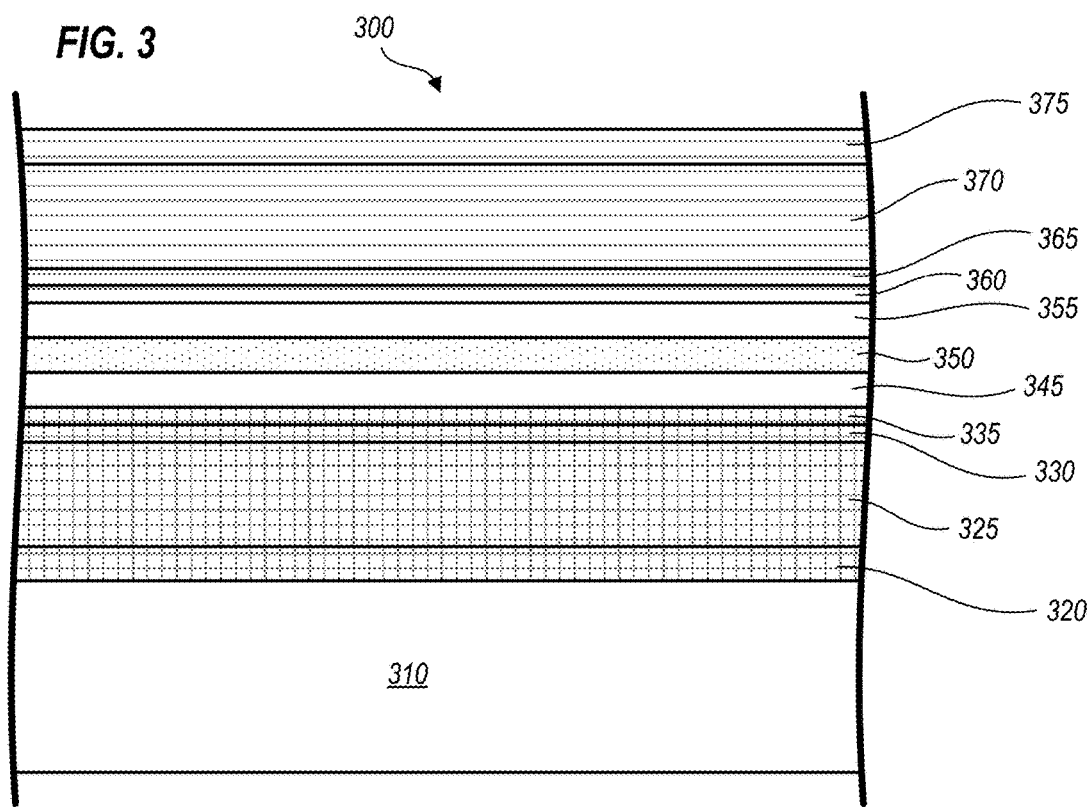
FIG. 3 shows a schematic cross-section of exemplary layers in an "n-up" as-grown configuration, according to one or more embodiments.

A schematic cross-section of exemplary layers in a first as-grown, "n-up" configuration 300 is shown in FIG. 3. Configuration 300 could be grown in wafer form and then singulated to form gain chip 100, FIG. 1. Configuration 300 begins with a compound semiconductor substrate 310 (which could be the same material as substrate 210, FIG. 2, since most or all of substrate 310 may be removed during the integration process for the photonic chip shown in FIG. 1). Upon substrate 310, p-type layers, an optional MQW region, and n-type layers are grown. In order, the exemplary layers of as grown, "n-up" configuration 300 include a p contact layer 320, a p buffer layer 325, a p etch stop layer 330, a p spacer layer 335, an undoped confinement layer 345, optional MQWs 350, another undoped confinement layer 355, an n spacer layer 360, an n etch stop layer 365, an n buffer layer 370 and an n contact layer 375. Certain ones of the layers shown in as-grown, "n-up" configuration 300 are present to facilitate electrical contact, optical confinement and/or fabrication needs. Thus, many of these layers could be modified or omitted, and/or further layers could be added, depending at least on the desired final product, and the wafer fabrication tools available.

In the present discussion, the term "undoped" shall be understood to mean "not intentionally doped," that is, "undoped" does not preclude normal background or contaminant levels of elements that are normally found in most or all semiconductors. "Undoped" materials herein may have actual concentrations of a given dopant that are generally less than about $5\times10^{16}$ atoms/cm$^3$, usually less than about $1\times10^{16}$ atoms/cm$^3$, and possibly less than about $5\times10^{15}$ atoms/cm$^3$.

Growing the gain chip in the as-grown, "n-up" configuration, and using Zn, for example, as the p-type dopant, requires introducing a significant quantity of Zn into the spacer, etch stop and buffer layers that are grown early in the gain chip layer stack. Thus, Zn is already present in the lower layers while the optional MQWs and upper, n-type contact layers are grown. Because of the relatively high temperatures involved with layer growth (and/or other wafer fabrication steps) and the concentration of Zn throughout the p-type layers (layers 320, 325, 330 and 335) significant diffusion of Zn can occur, with the Zn moving upwards from the p-type layers, toward and possibly into or through optional MQWs 350. Similar effects can also occur when other elements, such as Cd or Mg, are used for the p-type dopant.

Figure 4:
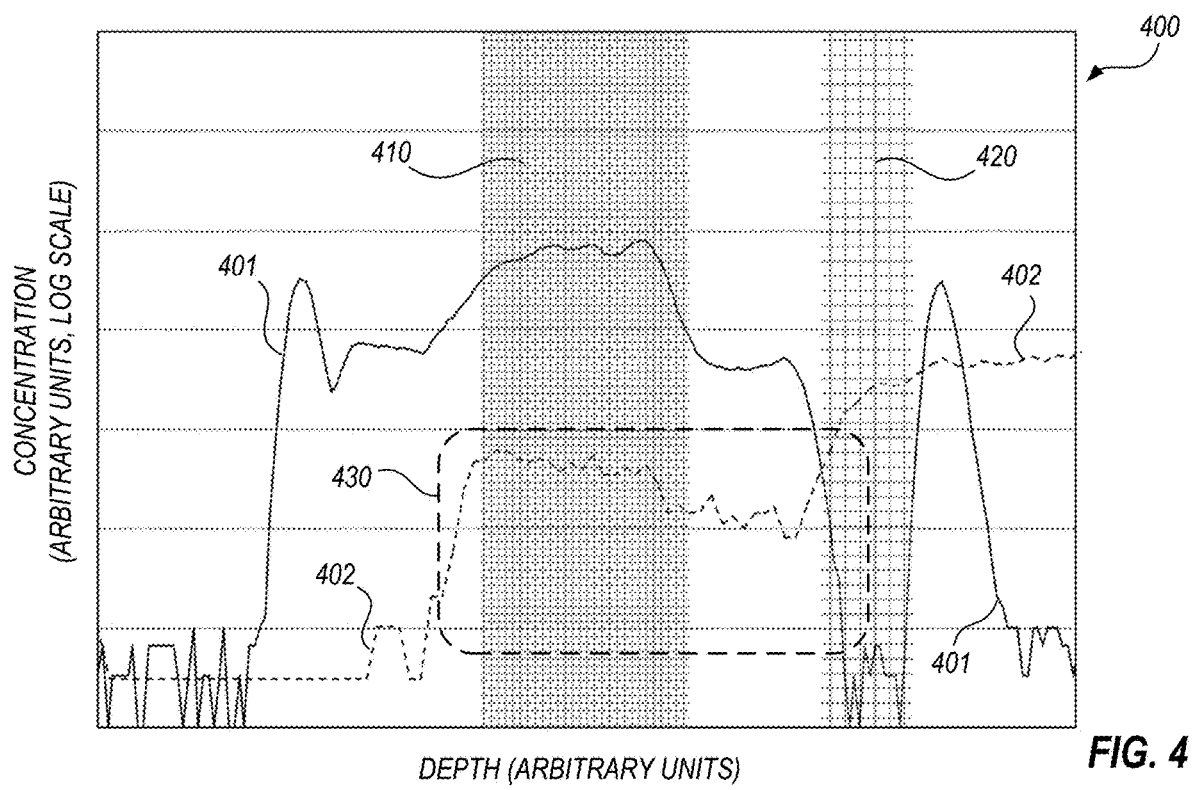
FIG. 4 shows a Secondary Ion Mass Spectroscopy (SIMS) analysis of a gain chip layer stack grown according to the cross-section of FIG. 3, according to one or more embodiments.

FIG. 4 shows a secondary ion mass spectroscopy (SIMS) analysis 400 of a portion of a gain chip layer stack that was grown according to the cross-section of FIG. 3. A solid line 401 indicates gallium concentration, and a broken line 402 indicates zinc concentration, both as a function of depth. The concentration (vertical) scale is in arbitrary units with each broken horizontal line representing a factor of 10 in concentration. The depth (horizontal) scale is also in arbitrary units, with the left hand side of FIG. 4 corresponding to an uppermost surface of the analyzed region, and depth within the sample increasing to the right. The region analyzed in FIG. 4 begins within the n-buffer layer and extends into the p-buffer layer, as defined in FIG. 3. A depth range 410 corresponds to the approximate depth of MQWs 350, and another depth range 420 corresponds to the approximate depth of p spacer layer 335, as identified in FIG. 3. A region 430 in which a measurable concentration of Zn exists, extending from part of p-spacer layer up through and slightly above MQWs 350, is noted. The amount of Zn found in region 430 is undesirable.

In an improved version of the structure illustrated in FIGS. 3 and 4, Zn migration was significantly reduced by changing p spacer layer 335, between the p-doped layers and MQWs 350 in FIG. 3, to an undoped spacer layer. In the present discussion, the term "undoped" shall be understood to mean "not intentionally doped," that is, "undoped" does not preclude normal background or contaminant levels of elements that are normally found in most or all semiconductors. "Undoped" materials herein may have actual concentrations of a given dopant that are generally less than about $2\times10^{16}$ atoms/cm$^3$, usually less than about $1\times10^{16}$ atoms/cm$^3$, and possibly less than about $5\times10^{15}$ atoms/cm$^3$. It is also emphasized that although structures including MQWs and use of Zn as a dopant are discussed herein as examples, other structures may benefit from blocking the diffusion of dopants, and the principles discussed below apply equally to structures that do not include MQWs, and/or use dopants other than Zn.

Compared to the p spacer layer, the undoped spacer layer both reduces the amount of dopant initially placed near to sensitive regions such as MQWs, and forms a diffusion barrier to the underlying doped layers during subsequent high temperature processing. In many epitaxial and fabrication sequences, most high temperature processing occurs in the epitaxial processing itself. In conventional laser structures, the n-type layers are grown first and the p-type layers are grown second, so that the p-type regions are subject to high growth temperatures for only a short period. For structures in which the p-type layers are grown first, the p-type layers are exposed to high temperatures for a longer time and may experience significant Zn (or Cd or Mg) diffusion ingress during the epitaxial processing alone. Therefore, there may be relatively little reason to add an undoped spacer layer when the as-grown configuration grows the n-type layer(s) first and the p-type layer(s) second.

Materials that can be used for an undoped spacer layer can be determined by characteristics such as compatibility with the lattice structure of the underlying substrate and/or overlying layers, low diffusivity of the selected dopant at MBE/MOCVD and other wafer fabrication temperatures, high bandgap, and sufficient current injection efficiency. In lasers, current injection efficiency is important because the modulated current going to the MQWs will pass through the layer. The minimum bandgap is that which will make the spacer layer transparent to light being generated by, or otherwise associated with, the final product. Specific values of these characteristics can easily be determined by one skilled in the art for possible diffusion blocking layer materials without undue experimentation, given knowledge of the lattice structure of the substrate, the wavelength of the light intended to be generated by, or otherwise associated with operation of, a photonic chip into which the gain medium will be integrated, and the likely times and temperatures of MBE/MOCVD growth and/or subsequent fabrication steps. For example, good diffusion blocking layer materials for InP related compounds include InP, InGaAsP, InGaAlAs, and InGaAlAsP.

Experimentally, it has been validated that an undoped InP layer provides a useful barrier to such Zn migration within a layer stack grown on an InP substrate. When intermediate layers grown on an InP substrate include mixtures of Al, Ga and/or In as group III materials, and As and/or P as group V materials, InGaAsP, InGaAlAs, or InGaAlAsP can also be used as the undoped layer. It is believed that layers up to about 500 nm thick, and thicker, would be useful, although thick layers would increase the volume of adjacent regions such as regions of MQWs. An undoped spacer layer as thin as 25 or 50 nm, or even less, possibly down to 5 nm, may also be effective in at least reducing Zn or other dopants somewhat in adjacent regions. Thus, possible nominal layer thicknesses for an undoped InP, InGaAsP, InGaAlAs, or InGaAlAsP spacer layer to reduce dopant diffusion include 5, 10, 20, 25, 30, 35, 40, 50, 60, 75, 85, 100, 110, 125, 135, 150, 175, 200, 250, 300, 350, 400, 450 and 500 nm, and thicknesses intermediate to these values. Maximum thickness of an undoped spacer layer can be determined as a tradeoff among effectiveness at blocking dopant diffusion (thicker is better), cost of material/epitaxial processing time (thinner is better), device effects such as series resistance through the layer (thinner is better), and various, application-specific process integration issues such as total layer stack height, effect on MQW placement within a layer stack, effects on etching through a layer stack, and the like (various ones could weigh towards thicker or thinner). For an exemplary process of fabricating a gain medium, maximum layer height was determined as about 125 nm, so as to substantially block Zn diffusion, with minimal material cost and a minimal increase in series resistance.

Figure 5:
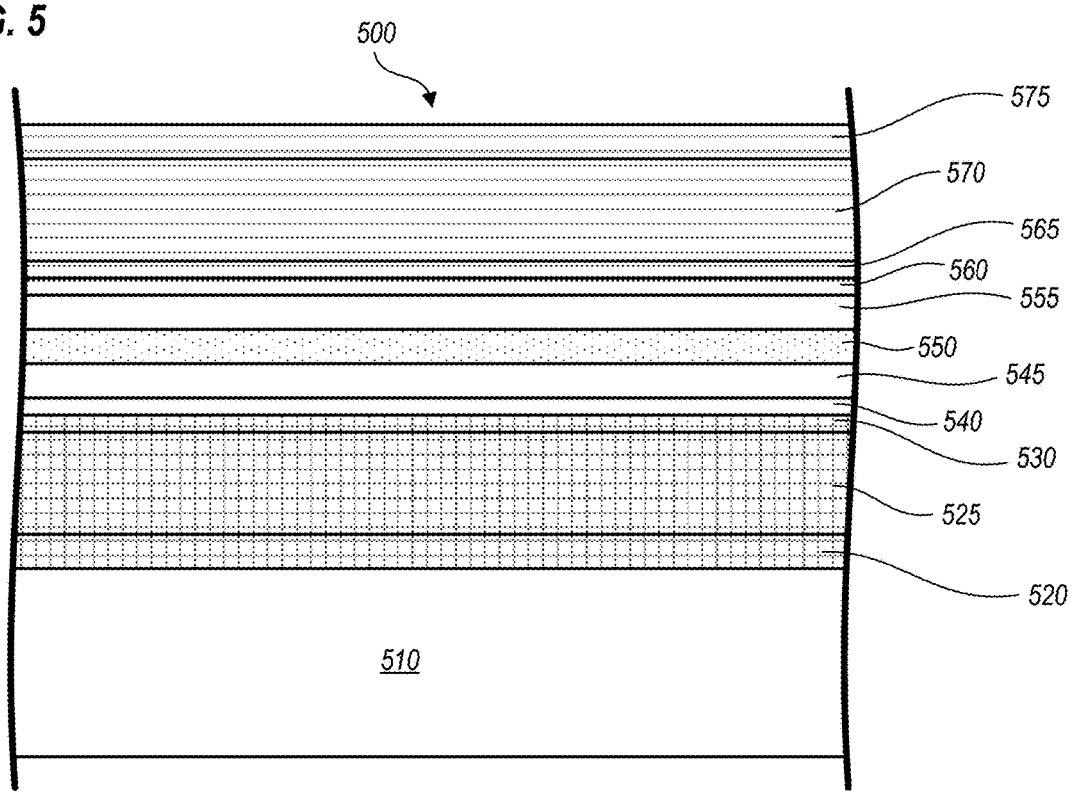
FIG. 5 shows a schematic cross-section of exemplary layers in a modified "n-up" as-grown configuration, according to one or more embodiments.

A schematic cross-section of exemplary layers for the modified, as-grown, "n-up" configuration 500 is shown in FIG. 5. Configuration 500 could be grown in wafer form and then singulated to form gain chip 100, FIG. 1. Configuration 500 begins with a compound semiconductor substrate 510 (which could be the same material as substrates 210/310, FIGS. 2, 3). Upon substrate 510, p-type layers, an optional MQW region, and n-type layers can be grown. In order, the exemplary layers of as grown, "n-up" configuration 500 include a p contact layer 520, a p buffer layer 525, a p etch stop layer 530, an undoped spacer layer 540, an undoped confinement layer 545, optional MQWs 550, another undoped confinement layer 555, an n spacer layer 560, an n etch stop layer 565, an n buffer layer 570 and an n contact layer 575. Similarly to configurations 200 and 300, certain ones of the layers shown in as-grown, "n-up" configuration 500 are present to facilitate electrical contact, optical confinement and/or fabrication needs and could be modified or omitted, and further layers could be added.

Figure 6:
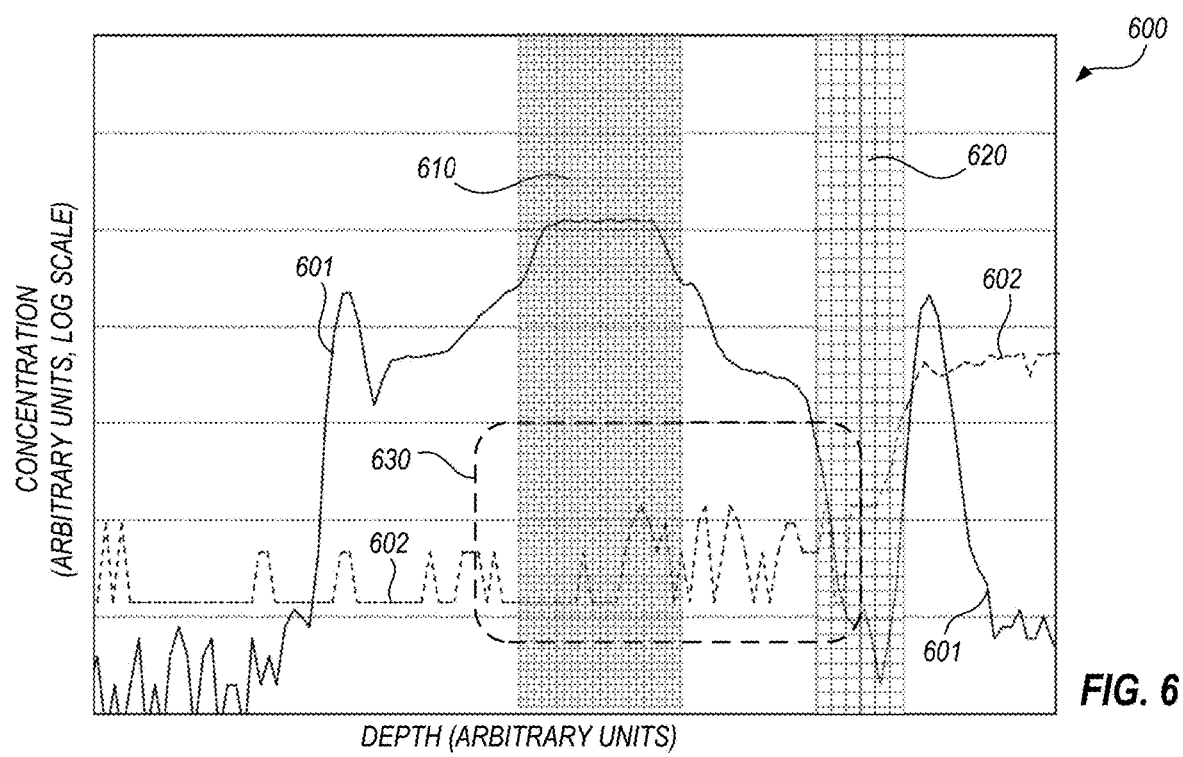
FIG. 6 shows a SIMS analysis of a gain chip layer stack grown according to the cross-section of FIG. 5, according to one or more embodiments.

FIG. 6 shows a SIMS analysis 600 of a portion of a gain chip layer stack grown with an undoped spacer on the p-side, according to the cross-section of FIG. 5. Similar to those shown in FIG. 4, a solid line 601 indicates gallium concentration, and a broken line 602 indicates zinc concentration, both as a function of depth. The concentration (vertical) scale is in arbitrary units with each broken horizontal line representing a factor of 10 in concentration. The depth (horizontal) scale is also in arbitrary units, with the left hand side of FIG. 6 corresponding to an uppermost surface of the analyzed region, and depth within the sample increasing to the right. The region analyzed in FIG. 6 begins within the n-buffer layer and extends into the p-buffer layer, as defined in FIG. 5. A depth range 610 corresponds to the approximate depth of MQWs 550. In FIG. 6, an identified region on the p-side is that of undoped spacer layer 540. It can be seen that the concentration of Zn at depths corresponding to p buffer layer 525 and contact layer 520 are similar to those in SIMS analysis 400, FIG. 4, but the concentration of Zn in a region 630 around MQWs 550 is reduced by about an order of magnitude, compared with the corresponding region in SIMS analysis 400. The reduced Zn concentration around MQWs 550 is expected to provide a reliability improvement for devices fabricated according to n-up configuration 500, FIG. 5, as compared to devices fabricated according to n-up configuration 300, FIG. 3.

Figure 7:
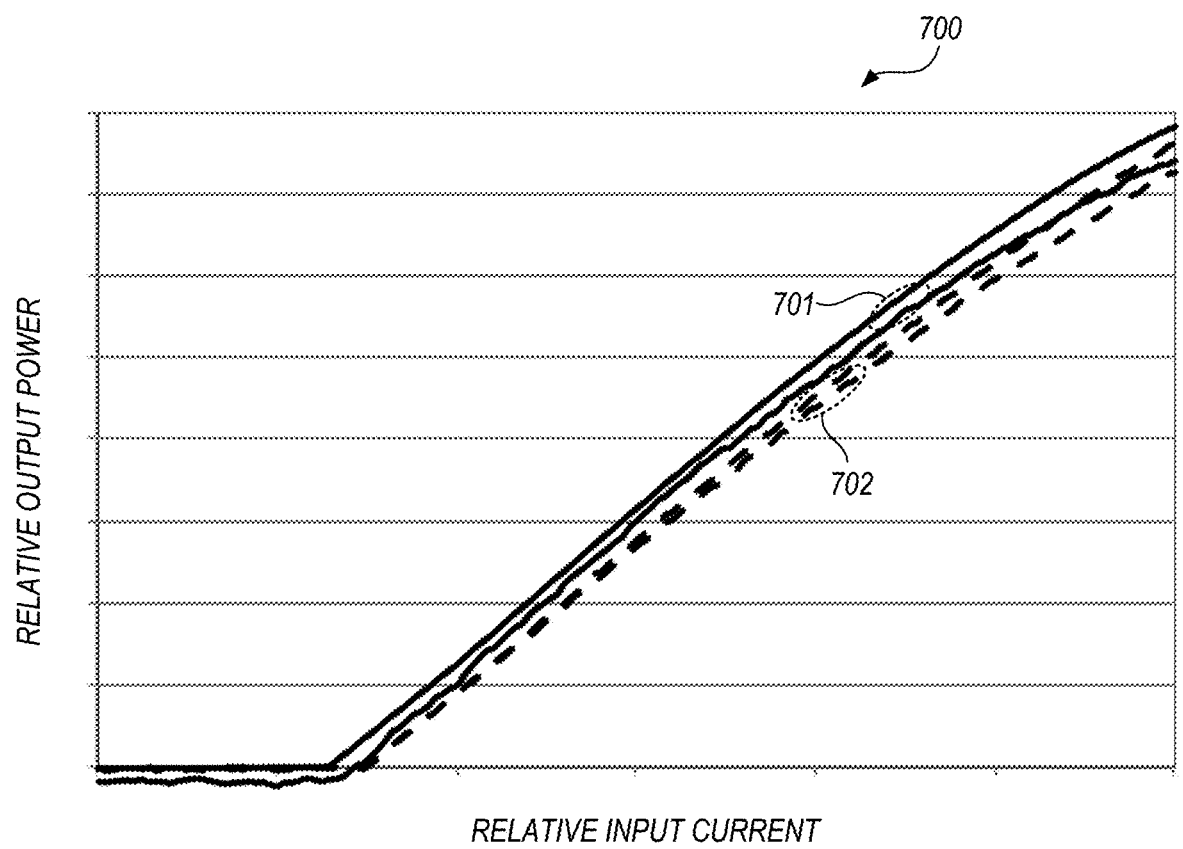
FIG. 7 is a plot of output light vs. input current illustrating performance of otherwise identical devices with a Zn doped spacer and an undoped spacer, respectively, according to one or more embodiments.

FIG. 7 is a plot of output light vs. input current illustrating performance of otherwise identical devices with a Zn doped spacer and an undoped spacer, respectively (e.g., devices with the cross-sectional profiles illustrated in FIGS. 3 and 5, respectively). The tested devices were configured as gain chips for lasers. Results for the devices with undoped spacers are shown in solid lines, and results for the devices with Zn doped spacers are shown in broken lines. Laser thresholds and slope efficiencies for the tested devices with undoped spacer layers are shown to be at least equivalent to those with p-doped spacer layers.

Figure 8:
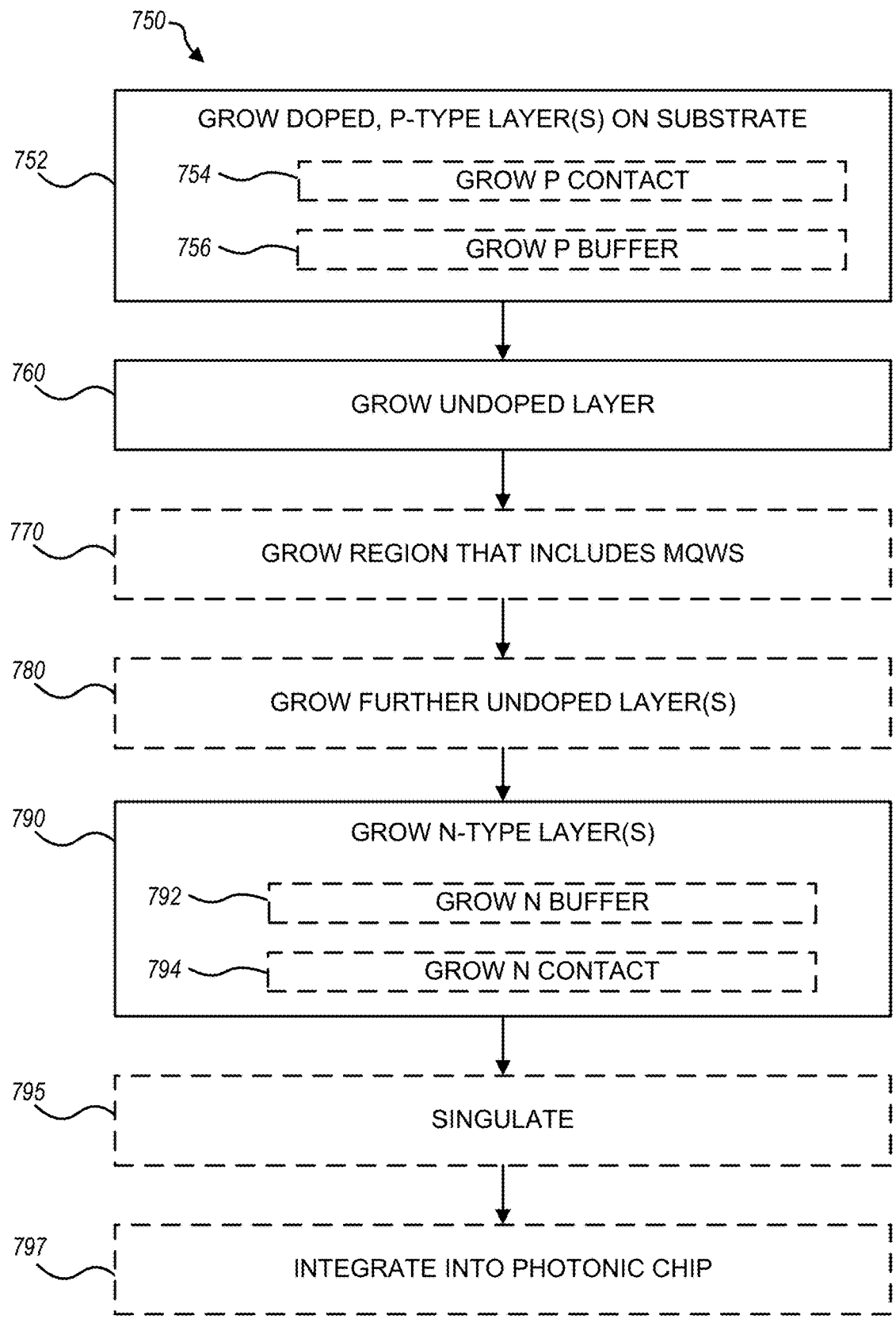
FIG. 8 is a flowchart of a method 750 of fabricating a gain medium, according to one or more embodiments.

FIG. 8 is a flowchart of a method 750 of fabricating a gain medium. Steps of method 750 can be used, for example, to fabricate gain chip 100, FIG. 1, or the exemplary layers for the as-grown, "n-up" configuration 500 shown in FIG. 5. The illustrated steps of method 750 include steps that are optional, and it should be understood that method 750 may be performed with or without such steps, as well as performing certain steps in a different order than is shown, as discussed below.

Step 752 of method 750 grows one or more p-type layers on a compound semiconductor substrate, for example using Zn, Cd or Mg as a dopant. Examples of step 752 include growing p contact layer 520, p buffer layer 525 and/or p etch stop layer 530, as illustrated in FIG. 5. Growing p contact layer 520 and p buffer layer 525 are illustrated in FIG. 8 as optional substeps 754 and 756.

Step 760 of method 750 grows an undoped buffer layer of sufficient thickness to reduce dopant diffusion from the p-type layers during subsequent growth and/or wafer fabrication steps. An example of step 760 is growing undoped spacer layer 540, FIG. 5. As discussed above, the layer grown in step 760 must be epitaxially compatible with underlying and overlying layers, and knowledge of dopant diffusivity for the layer grown in step 760 enables one skilled in the art to determine a thickness of the undoped spacer to ensure that dopant diffusion is sufficiently blocked during subsequent growth and/or wafer fabrication steps.

In an optional step 770, a region that includes MQWs is grown. In another optional step 780, further undoped layers are grown. The inclusion, order and repetition of optional steps 770 and/or 780 are optional to method 750, and are determined according to the final application of the layer stack being grown. For example, for gain chip applications, optional MQWs (step 770) may be desired, and it may be desirable to grow confinement layers (step 780) above and below the MQWs. Another example of step 780 could be growing a thick undoped layer, without MQWs, for use in a photodiode application.

In step 790, n-type layers are grown. Examples of step 790 are growing n spacer layer 560, n etch stop layer 565, n buffer layer 570 and/or n contact layer 575, as illustrated in FIG. 5. Growing n buffer layer 570 and n contact layer 575 are illustrated in FIG. 8 as optional substeps 792 and 794.

One further optional steps of method 750 is a step 795 of singulating the substrate on which the above-noted layers have been grown, to form individual chips such as gain chips, photodiodes and the like. Another further optional step of method 750 is a step 797 of integrating the layer stack grown into a photonic chip. Depending on the desired application, steps 795 and 797 may be done in either order and/or repeated. An example of steps 795 and 797 performed in sequence is singulating a wafer into individual gain chips, and integrating one or more of the gain chips into photonic chips (e.g., as shown schematically in FIG. 1). An example of step 797 performed alone is adding further fabrication steps before and/or after the other steps of method 750, to fabricate layer stacks into photonic devices (e.g., light emitting diodes, edge emitters, vertical cavity surface emitting lasers (VCSELs) and/or photodiodes), or other diodes or transistors, in wafer form. One skilled in the art will readily conceive many equivalents, extensions, modifications, adaptations and alternatives.

Therefore, the above-described techniques of providing an undoped layer between an underlying doped layer and overlying layers can be applied to layer stacks used to fabricate many products. Compound semiconductor products that are fabricated from layer stacks grown in an "n-up" configuration (e.g., with undoped and/or n-type layers grown after a p-type, Zn, Cd or Mg doped layer) are expected to benefit similarly from addition of an undoped layer, or substitution of an undoped layer for a doped layer, to block dopant diffusion from undoped and/or p-type layers. Products that may benefit from an undoped layer to block dopant diffusion may include, but are not limited to, gain media, light emitting diodes, edge emitter lasers, VCSELs, modulators, photodiodes, power diodes, transistors and the like. Appropriate thickness and material type of a useful undoped layer can be determined by considering the thermal profile of the growth operation and subsequent fabrication steps, diffusivity of dopant in the undoped layer and adjacent layers throughout the expected growth and fabrication thermal profiles, lattice compatibility, bandgap, and/or current injection efficiency. Compound semiconductor layer stacks thus grown may include III-V or II-VI semiconductors.

The foregoing is provided for purposes of illustrating, explaining, and describing embodiments of the present invention. Upon reading and comprehending the present disclosure, one of ordinary skill in the art will readily conceive many equivalents, extensions, modifications, adaptations and alternatives. These equivalents, extensions, modifications, adaptations and alternatives may be made without departing from the scope or spirit of the invention. Different arrangements of the components depicted in the drawings or described above, as well as components and steps not shown or described, are possible. Similarly, some features and subcombinations are useful and may be employed without reference to other features and subcombinations.

The above description of exemplary embodiments of the invention has been presented for the purposes of illustration and description. It is not intended to be exhaustive or to limit the invention to the precise form described, and many modifications and variations are possible in light of the teaching above. Embodiments of the invention have been described for illustrative and not restrictive purposes, and alternative embodiments will become apparent to readers of this patent. The embodiments were chosen and described in order to explain the principles of the invention and practical applications thereof, to enable others skilled in the art to best utilize the invention in various embodiments and with various modifications as are suited to the particular use contemplated. Accordingly, the present invention is not limited to the embodiments described above or depicted in the drawings, and various embodiments and modifications can be made without departing from the scope of the claims below.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary. All patents, patent applications, publications, and descriptions mentioned here are incorporated by reference in their entirety for all purposes. None is admitted to be prior art.

What is claimed is:

1. A gain medium, comprising:
   a p-type layer that defines a first surface and an opposing second surface, the p-type layer being doped using zinc;
   an undoped layer that defines a first surface and an opposing second surface that are separated by a thickness of the undoped layer, the thickness being within a thickness range of 5 nm to 500 nm, the first surface of the undoped layer adjoining the second surface of the p-type layer;
   a region that includes multiple quantum wells (MQWs), wherein the region defines a first surface and an opposing second surface that are separated by a thickness of the region, and a first surface of the region adjoins the second surface of the undoped layer; and
   an n-type layer that defines a first surface and a second surface that are separated by a thickness of the n-type layer, the first surface of the n-type layer adjoining the second surface of the region;
   wherein:
   the p-type layer, the undoped layer, the region and the n-type layer are formed of one or more compound semiconductor materials that are characterized by epitaxially compatible crystalline lattice structures; and the p-type layer, the undoped layer, the region and the n-type layer form a single crystalline structure that extends continuously from the p-type layer through the n-type layer.

2. The gain medium of claim 1, further comprising a substrate characterized by the epitaxially compatible crystalline lattice structure, and wherein the p-type layer, the undoped layer, the region and the n-type layer successively adjoin the substrate.

3. The gain medium of claim 2, wherein the p-type layer, the undoped layer, the region and the n-type layer are successively grown on the substrate using one of metallorganic chemical vapor deposition and molecular beam epitaxy.

4. The gain medium of claim 1, wherein the thickness of the undoped layer is within a range of 25 to 125 nm.

5. The gain medium of claim 1, wherein the p-type layer, the undoped layer, the region and the n-type layer form part of a semiconductor wafer.

6. The gain medium of claim 1, wherein the p-type layer, the undoped layer, the region and the n-type layer form a gain chip.

7. The gain medium of claim 6, wherein the gain chip is integrated within a photonic chip.

8. The gain medium of claim 7, wherein a bandgap of the undoped layer is high enough to make the undoped layer transparent to light associated with operation of the photonic chip.

9. The gain medium of claim 1, wherein the p-type layer, the region and the n-type layer are grown on an InP crystalline lattice, and the undoped layer includes one or more of InP, InGaAsP, InGaAlAs, or InGaAlAsP.

10. A method of fabricating a gain medium, comprising:
growing a p-type layer doped with zinc on a substrate;
growing an undoped layer comprising one or more of InP, InGaAsP, InGaAlAs, or InGaAlAsP on the p-type layer;
growing a region that includes multiple quantum wells (MQWs) on the undoped layer; and
growing an n-type layer on the region;
wherein growing the undoped layer comprises growing the undoped layer to a thickness that is sufficient to prevent Zn diffusion from the p-type layer into the region during subsequent growth or wafer fabrication steps.

11. The method of claim 10, wherein each of the steps of growing comprises using metallorganic chemical vapor deposition or molecular beam epitaxy.

12. A compound semiconductor layer stack, comprising:
one or more p-type layers, formed of crystalline, compound semiconductor material grown on a crystalline substrate, wherein at least one of the one or more p-type layers comprises Zn as a dopant;
an undoped layer, formed of crystalline, compound semiconductor material grown on the one or more p-type layers; and
one or more n-type layers, formed of crystalline, compound semiconductor material grown on the undoped layer;
wherein the undoped layer comprises InP, InGaAsP, InGaAlAs, or InGaAlAsP, and is of sufficient thickness to reduce zinc diffusion from the p-type layer toward the n-type layers during growth of the one or more n-type layers.

13. The compound semiconductor layer stack of claim 12, wherein the undoped layer defines a thickness in the range of 5 nm to 500 nm.

14. The compound semiconductor layer stack of claim 12, wherein the crystalline substrate is a compound semiconductor wafer.

15. The compound semiconductor layer stack of claim 12, wherein the crystalline substrate is an individual chip singulated from a compound semiconductor wafer.

16. The compound semiconductor layer stack of claim 15, wherein the compound semiconductor wafer is singulated to form a plurality of gain chips, and at least one of the gain chips is integrated with one or more waveguides within a photonic chip.

17. The compound semiconductor layer stack of claim 12, wherein further fabrication steps are applied to the layer stack, to form one or more of a light emitting diode, an edge emitter laser, a vertical cavity surface emitting laser, a modulator, a photodiode, or a power diode.

18. The method of claim 10, wherein growing the undoped layer comprises limiting the undoped layer to a thickness between 5 nm and 500 nm.

19. The method of claim 10, wherein the substrate is a compound semiconductor wafer, and further comprising singulating the compound semiconductor wafer to form a plurality of gain chips.

20. The compound semiconductor layer stack of claim 16, wherein a bandgap of the undoped layer is high enough to make the undoped layer transparent to light associated with operation of the photonic chip.

* * * * *